(12) United States Patent
Choi

(10) Patent No.: US 6,723,648 B2
(45) Date of Patent: Apr. 20, 2004

(54) FABRICATING FERROELECTRIC MEMORY DEVICE

(75) Inventor: Eun-Seok Choi, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 13 days.

(21) Appl. No.: 10/136,443

(22) Filed: May 2, 2002

(65) Prior Publication Data

US 2002/0173097 A1 Nov. 21, 2002

(30) Foreign Application Priority Data

May 3, 2001 (KR) ........................................ 2001-24064

(51) Int. Cl.$^7$ ............................................ H01L 21/302
(52) U.S. Cl. ........................ 438/694; 438/697; 438/702; 438/717; 438/720; 438/722
(58) Field of Search ................................. 438/694, 697, 438/702, 717, 720, 722, 695

(56) References Cited

U.S. PATENT DOCUMENTS

| | | | |
|---|---|---|---|
| 5,516,363 A | 5/1996 | Azuma et al. | |
| 5,559,260 A | 9/1996 | Scott et al. | |
| 5,624,707 A | 4/1997 | Azuma et al. | |
| 5,654,456 A | 8/1997 | Scott et al. | |
| 5,688,565 A | 11/1997 | McMillan et al. | |
| 6,025,619 A | 2/2000 | Azuma et al. | |
| 6,294,425 B1 * | 9/2001 | Hideki ........................ | 438/253 |
| 6,320,214 B1 * | 11/2001 | Matsuda et al. ............. | 257/295 |
| 6,388,285 B1 * | 5/2002 | Black et al. ................. | 257/315 |
| 6,570,396 B1 * | 5/2003 | Kister ......................... | 324/754 |
| 6,612,082 B2 | 9/2003 | Schimmelpfennig et al. | |

* cited by examiner

Primary Examiner—Robert Kunemund
Assistant Examiner—Binh X. Tran
(74) Attorney, Agent, or Firm—Pillsbury Winthrop LLP

(57) ABSTRACT

A method for fabricating a high density ferroelectric memory device is disclosed in which the burden of etching a storage electrode and a plate electrode is alleviated, and a ferroelectric capacitor module is made highly dense. A seed layer and a sacrificial layer are sequentially formed on a semiconductor substrate. The sacrificial layer is selectively etched to form a loop-shaped sacrificial layer pattern. First and second electrodes are simultaneously formed on the seed layer (thus exposed) by carrying out an electrochemical deposition process after formation of the sacrificial layer pattern. The sacrificial layer pattern is removed. The seed layer (thus exposed) is etched after removal of the sacrificial layer pattern. A ferroelectric thin film is formed by carrying out a spin-on process on the entire surface including the first and second electrodes.

18 Claims, 5 Drawing Sheets

FABRICATING FERROELECTRIC MEMORY DEVICE

BACKGROUND

The inventions disclosed and/or claimed herein relate in general to methods for fabricating a ferroelectric memory device. Particularly, the inventions relate to methods for fabricating a ferroelectric memory device in which a ferroelectric capacitor module is made highly dense.

Generally, in a semiconductor memory device, efforts have been made to develop a large capacity memory device in which a ferroelectric thin film is used in a ferroelectric capacitor so that the refresh limitation of the DRAM (dynamic random access memory) can be overcome.

Such a ferroelectric random access memory ("FeRAM") which utilizes the ferroelectric thin film is a kind of nonvolatile memory device.

This FeRAM retains the stored information even when power is not applied, and its operating speed is comparable to the DRAM. Accordingly, this FeRAM is gaining attention as a next generation memory device.

The charge storing material for this Fe RAM device, is a ferroelectric thin film such as $SrBi_2Ta_2O_9$ ("SBT") and $Pb(Zr,Ti)O_3$ ("PZT").

The ferroelectric thin film has a dielectric constant of several hundreds to several thousands at the normal temperature, and has two stable remnant polarizations (Pr). Thus it is formed into a form of a thin film to use it in the nonvolatile memory.

The nonvolatile memory device which uses the ferroelectric thin film utilizes a hysteresis characteristic to store '1s' and '0s' in accordance with the remnant polarization which is present when the electric field is removed after inputting the signals by adjusting the polarization direction in the direction of the imposed electric field.

In the FeRAM device, in the case where a ferroelectric thin film such as $Sr_xBi_y(Ta_iNb_j)_2O_9$ ("SBTN") having a pervskite structure or the like is used for the ferroelectric capacitor, there are formed upper and lower electrodes which are generally made of Pt, Ir, Ru, IrO, RuO, Pt-alloy or the like.

FIGS. 1A (PRIOR ART) and 1B (PRIOR ART) illustrate a conventional fabricating method for a ferroelectric memory device.

As shown in FIG. 1A (PRIOR ART), a transistor fabricating process is carried out. A word line 12 is formed on a semiconductor substrate 11, and a source/drain 13 is formed at the both sides of the word line 12.

Then an interlayer insulating film 14 is formed on the semiconductor substrate 11, and then, the interlayer insulating film 14 is selectively patterned to form a plugging contact hole so as to expose the source/drain 13.

Then polysilicon is deposited on the entire surface of the structure, and then, an etchback or a chemical-mechanical polishing (CMP) is carried out, thereby forming a polysilicon plug 15.

Then a barrier film 16 is formed on the polysilicon plug 15, and then, an etchback or a chemical-mechanical polishing is carried out, thereby completely filling the plugging contact hole.

Under this condition, although it is not illustrated in the drawings, the barrier film 16 consists of a stacking of a Ti layer and a TiN layer, and $TiSi_2$ is formed by heat-treating the boundary between the Ti layer and the polysilicon plug 15.

Then an adhesive layer 17 is formed on the interlayer insulating film 14 which includes the barrier film 16. Then the adhesive layer 17 is selectively patterned to completely expose the barrier film 16, and to expose a part of the interlayer insulating film 14. Thus the adhesive layer 17 is formed for reinforcing the adhesive force between the interlayer insulating film 14 and a storage electrode to be formed later.

Then the storage electrode 18, a ferroelectric thin film 19 and a plate electrode 20 are sequentially formed on the interlayer insulating film 14 and on the adhesive layer 17.

Then as shown in FIG. 1B (PRIOR ART), first the plate electrode 20 is patterned, and then, the ferroelectric thin film 19 and the storage electrode 18 are sequentially patterned, thereby forming a vertically stacked capacitor.

Here, reference codes 18a~20a indicate the respective patterned portions. That is, reference code 18a indicates the storage electrode, 19a indicates the ferroelectric thin film, and 20a indicates the plate electrode.

However, in the above described conventional technique, the deposition process and the etching process have to be carried out for two or three times respectively after depositing the adhesive layer 17.

Accordingly, the fabricating process is complicated. Further, Pt, Ir, $IrO_2$, Ru, $RuO_2$ or the like is used for the storage electrode and for the plate electrode, while SBT, PZT, BLT or the like is used for the ferroelectric thin film. Thus the etching process is very difficult. Further, in the case where a 3-dimensional capacitor is fabricated, the mass production of the capacitor becomes difficult.

Further, according as the density of the device is increased, the size of the capacitor is gradually decreased, and the etching loss is gradually increased. Therefore, a fabricating process which can alleviate the burden of the etching process is demanded.

Further, in order to obtain the ferroelectric properties of the: FeRAM, there are carried out a crystallizing heat treatment and a degradation-compensating heat treatment after the deposition of the ferroelectric material. Accordingly, the characteristics of the oxidation preventing film have to be reinforced, so that the polysilicon plug under the storage electrode can be protected.

When the ferroelectric material and the storage electrode are etched after etching the plate electrode, an alignment margin for the masking process has to be secured. For this purpose, the storage electrode is given a far larger width than the plate electrode, and this becomes an impediment in the way toward a high density.

SUMMARY

The fabricating methods prescribed by the inventions described herein overcome the above described disadvantages of the conventional techniques. Our fabrication methods form a high density ferroelectric memory device wherein the burden of etching the storage electrode, the plate electrode and the ferroelectric thin film is alleviated, and the fabricating process is simplified with respect to conventional techniques.

Various of our claimed methods feature: sequentially forming a seed layer and a sacrificial layer on a semiconductor substrate; selectively etching the sacrificial layer to form a loop shaped sacrificial layer pattern; simultaneously forming first and second electrodes on the seed layer; removing the sacrificial layer pattern; etching the seed layer (thus exposed) after removal of the sacrificial layer pattern;

and forming a ferroelectric thin film by carrying out a spin-on process on an entire surface including the first and second electrodes.

In another respect, various of our claimed methods for fabricating a high density ferroelectric memory device feature: forming an insulating film on a semiconductor substrate; selectively etching the insulating film to form a contact hole so as to expose a part of the semiconductor substrate; forming a plug to bury it into the contact hole; forming a barrier film on the plug to completely fill the contact hole; sequentially forming a seed layer and a sacrificial layer on the insulating film including the barrier film; selectively etching the sacrificial layer to form a loop shaped sacrificial layer pattern; simultaneously forming first and second electrodes on the seed layer thus exposed after formation of the sacrificial layer pattern; removing the sacrificial layer pattern; etching the seed layer thus exposed after removal of the sacrificial layer pattern; and forming a ferroelectric thin film by carrying out a spin-on process on the entire surface including the first and second electrodes.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION

The inventions are explained further by describing some specific exemplary embodiments referring to the attached drawings, so that those ordinarily skilled in the art are enabled to carry out the inventions.

Figure 1A:
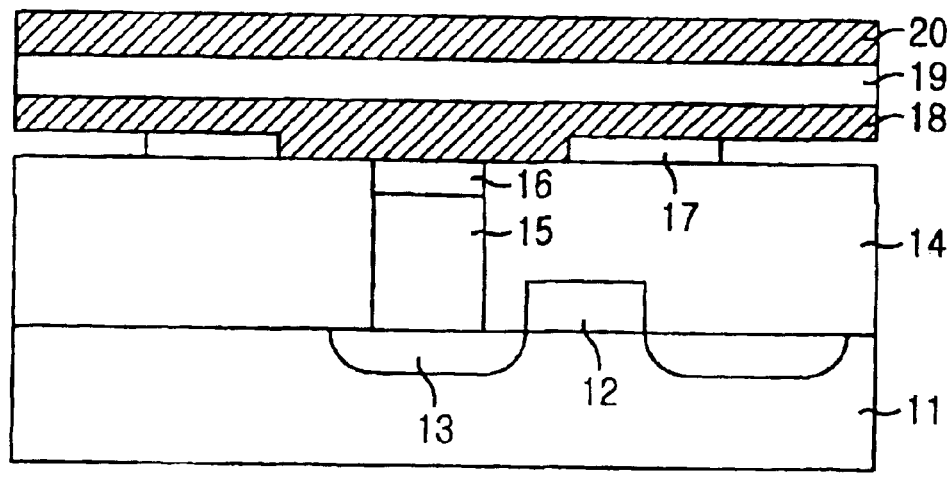
FIGS. 1A (PRIOR ART) and 1B (PRIOR ART) are sectional views showing the conventional method for fabricating the ferroelectric memory device.
Figure 1B:
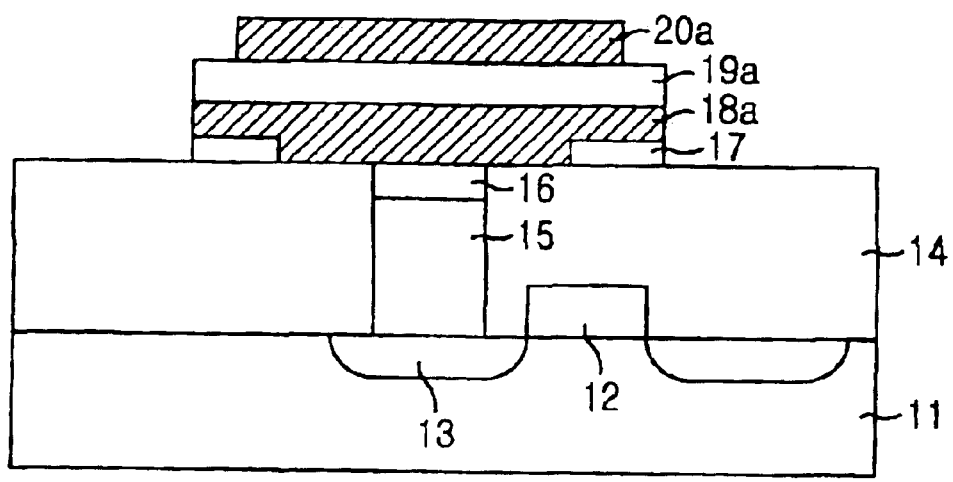
Figure 2:
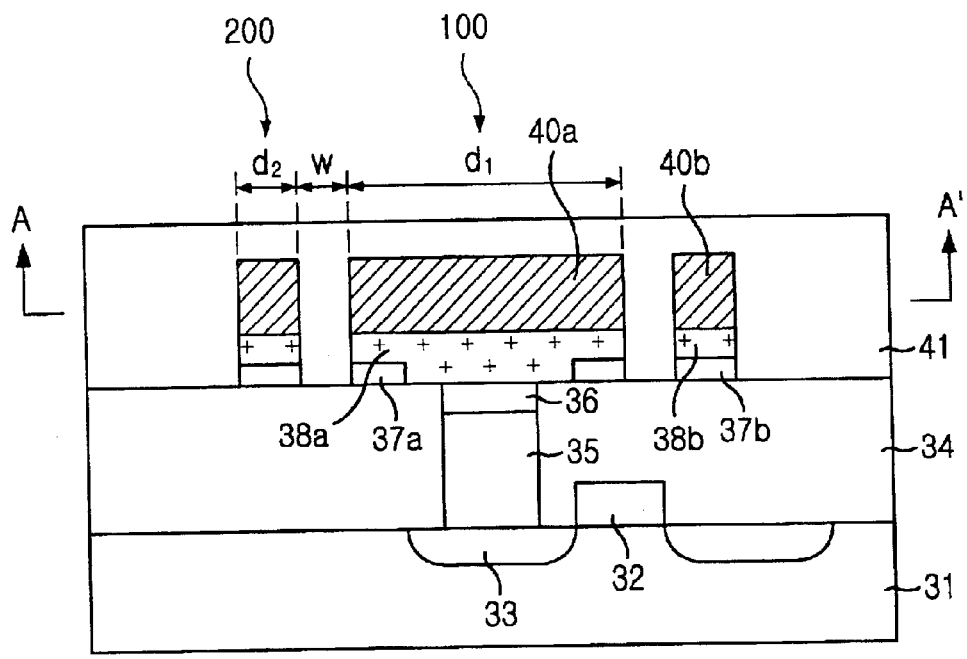
FIG. 2 is a sectional view of the ferroelectric memory device according to an embodiment of our inventions.
Figure 3:
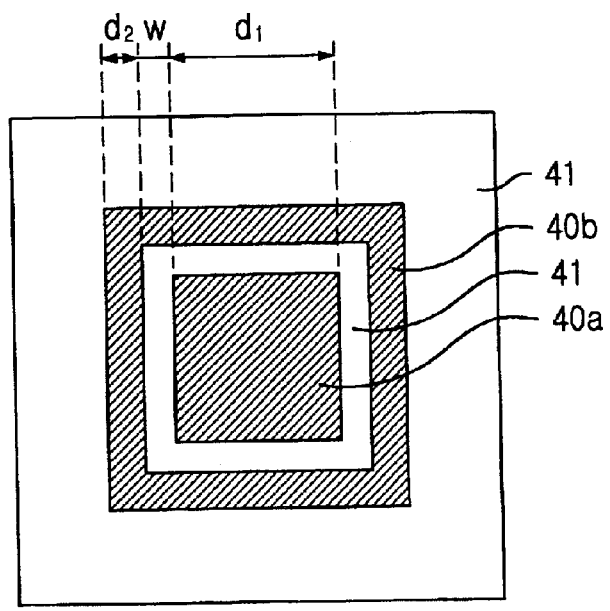
FIG. 3 is a plan view taken along a line A–A' of FIG. 2.

FIG. 2 is a sectional view of an embodiment of a ferroelectric memory device. FIG. 3 is a plan view taken along a line A–A' of FIG. 2.

As shown in FIG. 2, in the ferroelectric memory device, a word line 32 and a source/drain 33 are formed on a semiconductor substrate 31, thereby forming a transistor.

An interlayer insulating film 34 is formed on the transistor, and the interlayer insulating film 34 is etched to form a contact hole so as to expose a part of the source/drain 33. Then a polysilicon plug 35 and a barrier film 36 are sequentially filled into the contact hole.

Then a first adhesive layer 37a is formed in such a manner that it should not contact to the barrier film 36 but only to the interlayer insulating film 34. Then a first seed layer 38a is formed in such a manner that it should be contacted to the barrier film 36 and be overlapped with the first adhesive layer 37a. Then a storage electrode 40a is stacked thereupon, thereby forming a first electrode part 100.

Then a second adhesive layer 37b, a second seed layer 38b and a plate electrode 40b are formed in the cited order so as to form a second electrode part 200. The second electrode part 200 is separated from the first electrode part 100 by a certain distance w. Then a ferroelectric film 42 is formed to cover the tops of the first and second electrode parts 100 and 200 and the portion between the first and second electrode parts 100 and 200.

The storage electrode 40a and the plate electrode 40b are formed by carrying out an electrochemical deposition process (ECD) by utilizing the first and second seed layers 38a and 38b.

The distance w between the first and second electrode parts 100 and 200 and their widths d1 and d2 are adjusted when patterning the sacrificial layer (refer to FIG. 4b), while the heights of the storage electrode 40a and the plate electrode 40b are adjusted when carrying out the electrochemical deposition process (ECD).

Meanwhile, the plate electrode 40b is connected to a plate line during a wiring process at a later stage.

FIG. 3 is a plan view taken along a line A–A' of FIG. 2.

As shown in FIG. 3, the storage electrode 40a has a rectangular form having a width d1, while the plate electrode 40b has a loop-shaped form having a width d2. The storage electrode 40a and the plate electrode 40b are horizontally separated from each other by a distance w. Further, a ferroelectric film 41 is formed on the tops of the storage electrode 40a and the plate electrode 40b and on the portion between them.

Meanwhile, the storage electrode 40a may also have a circular form or a polygonal form besides the rectangular form. The plate electrode 40b may be of a polygonal loop-shaped form for surrounding the storage electrode 40a in the horizontal direction.

FIGS. 4A to 4D are sectional views showing an embodiment of fabricating methods for the ferroelectric memory device according to our inventions.

Figure 4A:
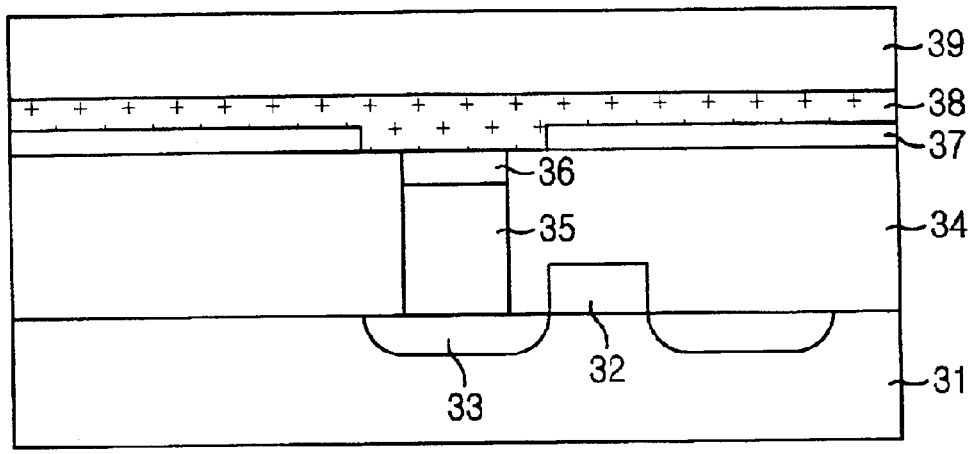
FIGS. 4A to 4D are sectional views showing the fabricating method for the ferroelectric memory device according to an embodiment of our inventions.

As shown in FIG. 4A, first a transistor fabricating process is carried out. A word line 32 is formed on a semiconductor substrate 31, and then, a source/drain 33 is formed on the semiconductor substrate 31 and at both sides of the word line 32.

Then an interlayer insulating film 34 is formed on the semiconductor substrate 31, and then, the interlayer insulating film 34 is selectively patterned to form a contact hole so as to expose a part of the source/drain 33.

Then polysilicon is deposited on the entire surface including the contact hole, and then, an etchback or a chemical-mechanical polishing process (CMP) is carried out to partly bury a polysilicon plug 35 into the contact hole. Then a barrier film 36 is filled upon the plug 35 into the contact hole to completely fill the contact hole, thereby forming a stacked structure of the polysilicon plug 35 and the barrier film 36.

Under this condition, the barrier film 36 is formed in the following manner. That is, a conductive layer (for barrier film) is formed on the entire surface including the polysilicon plug 35, and then, an etchback or a chemical-mechanical polishing process is carried out, to completely bury the contact hole.

Although it is not illustrated in the drawings, the barrier film 36 consists of a stacking of a Ti layer and a TiN layer, and TiSi$_2$ is formed by heat-treating the boundary between the Ti layer and the polysilicon plug 35.

Then an adhesive layer 37 is formed on the interlayer insulating film 34 including the barrier film 36, and then, the adhesive layer 37 is selectively patterned to completely expose the barrier film 36 and to expose a part of the interlayer insulating film 34 around the barrier film 36. Thus the adhesive layer 37 is formed to be connected to a capacitor storage electrode.

The adhesive layer 37 is for reinforcing the adhesive force between the storage electrode and the interlayer insulating film 34.

Then an electrochemical deposition process (ECD) is carried out on the entire surface including the barrier film 36 and the adhesive layer 37 so as to form a seed layer 38 which is for depositing the storage electrode and the plate electrode. Then a sacrificial layer 39 is formed on the seed layer 38.

Under this condition, the sacrificial layer 39 is formed at a thickness of 100 Å~50000 Å, and in forming the sacrificial layer 39, there can be used an oxide film or a photo-sensitive film or a film having a selectivity with the seed layer 38.

Figure 4B:
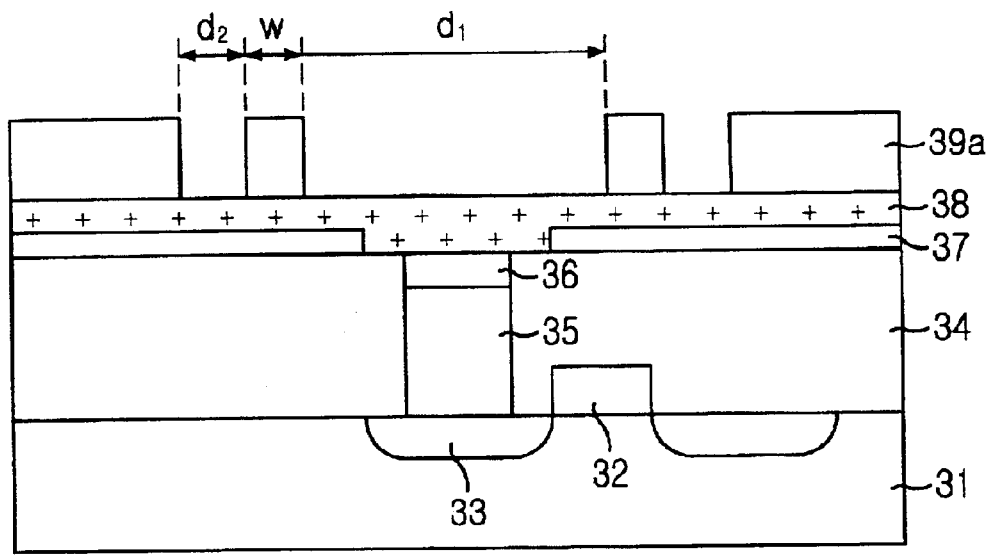

As shown in FIG. 4B, the sacrificial layer 39 is selectively patterned to form a sacrificial layer pattern so as to expose the seed layer 38.

Of the seed layer 38, the portions where the storage electrode and the plate electrode are to be formed are exposed. The width w of the sacrificial layer pattern 39a and the distances d1 and d2 between one of the sacrificial layer patterns 39a and another are decided later when deciding the widths of the storage electrode and the plate electrode.

Of the distances d1 and d2 between the sacrificial layer patterns 39a, d1 is larger than d2, but their widths may be made different. The thickness of the sacrificial layer pattern 39a makes it possible to adjust the height of the electrode which is filled between the sacrificial layer patterns 39a.

The width w of the sacrificial layer pattern 39a should be preferably 50 Å~10000 Å, and the sacrificial layer pattern 39a consists of an inner loop and an outer loop. Thus owing to the dual loops, the seed layer 38 is exposed in a looped form (refer to FIG. 3).

Figure 4C:
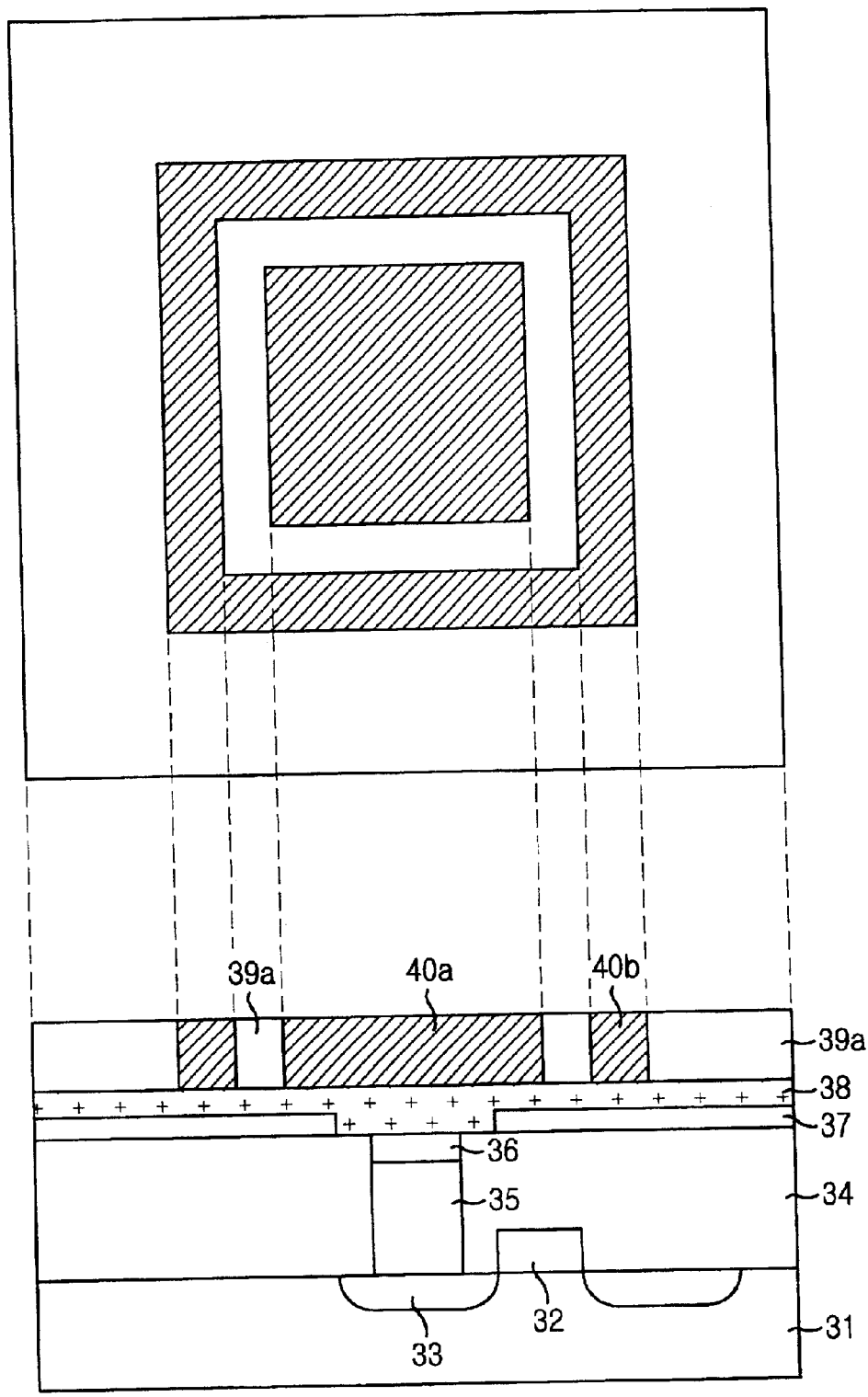

As shown in FIG. 4C, an electrochemical deposition process (ECD) is carried out only on the exposed seed layer 38 after the formation of the sacrificial layer pattern 39a, thereby simultaneously forming a storage electrode 40a and a plate electrode 40b.

Under this condition, the heights of the storage electrode 40a and the plate electrode 40b are made smaller than the thickness of the sacrificial layer pattern 39a. The storage electrode 40a and the plate electrode 40b are made of Pt, Ir, $IrO_2$, or $RuO_2$.

Figure 4D:
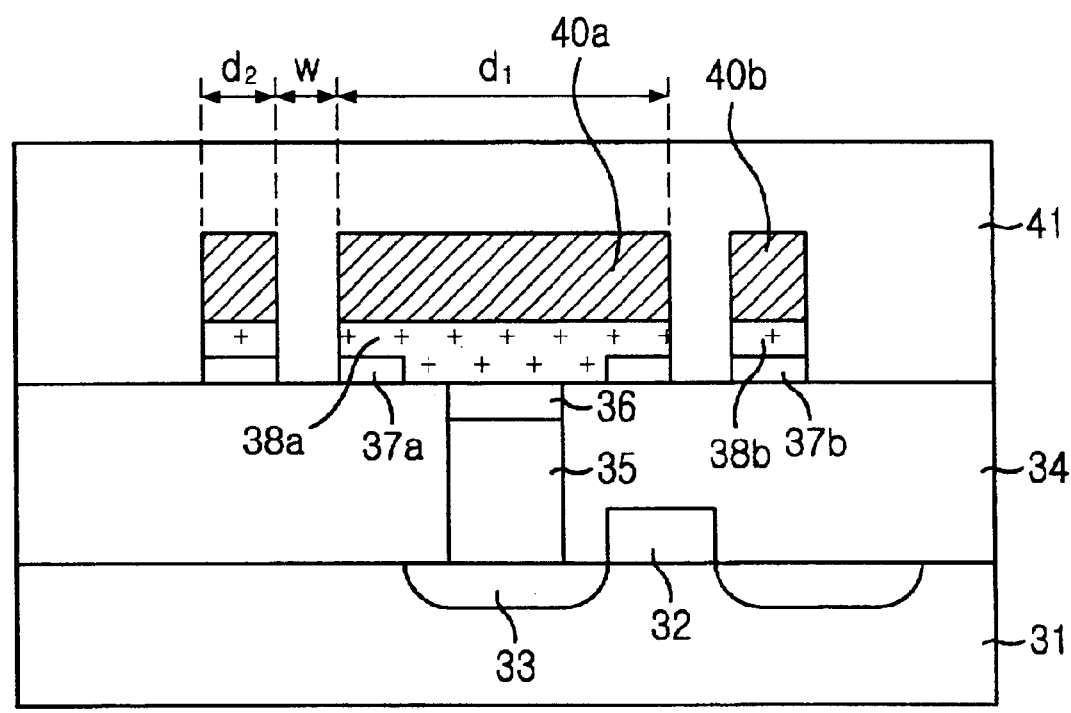

As shown in FIG. 4D, the sacrificial layer pattern 39a between the storage electrode 40a and the plate electrode 40b is removed, and then, a blanket etch is carried out to selectively remove the seed layer 38 and the adhesive layer 37 which are exposed between the storage electrode 40a and the plate electrode 40b, thereby isolating the storage electrode 40a and the plate electrode 40b from each other.

Thus the seed layer 38 and the adhesive layer 37 are simultaneously etched by the blanket etch. Accordingly, a first electrode part which is connected to the polysilicon plug 35 and to the barrier film 36 is formed. In the first electrode part, there are sequentially stacked a first adhesive layer 37a, a first seed layer 38a and the storage electrode 40a. Further, there is formed a second electrode part which is separated from the first electrode part by a certain distance w, and which consists of a stacking of a second adhesive layer 37b, a second seed layer 38b and the plate electrode 40b.

As shown in FIG. 3B, the first electrode part has a width as large as the distance d1 between the sacrificial layer patterns 39a, and is overlapped with the barrier film 36 but is larger than the barrier film 36 in its width.

Meanwhile, the second electrode part has a small width as small as the distance d2 between the sacrificial layer patterns 39a, and is horizontally separated from the first electrode part as much as the width w of the sacrificial layer pattern 39a, while surrounding the first electrode part in a form of loop.

That is, the first and second electrode parts are separated from each other as much as the width w of the sacrificial layer pattern 39a, i.e., as much as 50 Å~10000 Å.

Thus, the storage electrode 40a and the plate electrode 40b are formed not vertically but horizontally, so that the etching process for the electrodes can be skipped.

Then a ferroelectric film 41 such as SBT, BLT, PZT or the like is formed by carrying out a spin-on process on the entire surface including the storage electrode 40a and the plate electrode 40b. In this context, the spin-on process is carried out several times, and thus, a multiple-coated ferroelectric film 41 is formed.

Thus, if the spin-on process is employed, a flattening is naturally realized when forming the ferroelectric film 41. Further, the storage electrode 40a and the plate electrode 40b are covered or surrounded by the ferroelectric film 41 so as not to be exposed, and therefore, any lifting is prevented.

Further, the electric field is imposed not in the vertical direction but in the horizontal direction, and therefore, the ferroelectric film 41 can be made oriented in the direction of a-axis or b-axis which is larger in the polarization value.

Thus, the storage electrode 40a is surrounded by the plate electrode 40b, and the ferroelectric film 41 is formed on the tops of the two electrodes 40a and 40b and on the portion between the two electrodes 40a and 40b. Accordingly, a 3-dimensional capacitor is formed.

Then a heat treatment is carried out for a crystallization of the ferroelectric film 41.

Then a metal wiring process which is a post process is carried out in the usual manner.

The claimed inventions were described above in terms of specific exemplary preferred embodiments and the attached drawings, but it should be apparent to those ordinarily skilled in the art that various changes and modifications can be added without departing from the spirit and scope of the present invention which will be defined in the appended claims.

According to the present invention as described above, the burden of etching the thin films can be alleviated, so that the fabricating process can be easily carried out. The electrodes are formed not by etching, and therefore, any oxidation of the barrier film can be prevented, thereby improving the electrical characteristics of the capacitor.

The storage electrode and the plate electrode are formed in a single process simultaneously so as to be self-aligned. Therefore, the process margin is increased, and the fabricating process is simplified, with the result that the yield is improved.

The electric field is imposed in the horizontal direction, and therefore, the ferroelectric film can be oriented in the direction of a-axis or b-axis which is larger in the polarization value. The capacitor area can be arbitrarily adjusted through the ECD process, so that a sufficient capacitance can be secured.

A 3-dimensional capacitor can be formed by employing a spin-on process, and therefore, a chemical vapor deposition method is not required, while the mass production is facilitated. The electrodes of the capacitor are not exposed, and therefore, any lifting can be prevented.

What is claimed is:

1. A method for fabricating a high density ferroelectric memory device, comprising:

sequentially forming a seed layer and a sacrificial layer on a semiconductor substrate;

selectively etching the sacrificial layer to form a loop-shaped sacrificial layer pattern;

simultaneously forming first and second electrodes on the seed layer;

removing the sacrificial layer pattern; etching the seed layer after removal of the sacrificial layer pattern; and forming a ferroelectric thin film by carrying out a spin-on process on an entire surface including the first and second electrodes, wherein the first and the second electrodes are formed horizontally in the top of the seed layer.

2. The method as claimed in claim 1, wherein the first electrode and the second electrodes are formed by electrochemical deposition.

3. The method as claimed in claim 1, wherein the first electrode is separated from the second electrode as much as 50 Å~10000 Å.

4. The method as claimed in claim 1, wherein at the step of forming the ferroelectric thin film, the spin-on process is carried out several times to realize multiple spreading.

5. The method as claimed in claim 1, wherein the second electrode is formed in a form of loop, and the first electrode is formed within the second electrode.

6. The method as claimed in claim 1, wherein the seed layer and the first and second electrodes are formed by using any one of Pt, Ir, IrOx or RuOx.

7. The method as claimed in claim 1, wherein the ferroelectric thin film is a thin film of a material selected from the group of a strontium bismuth tantalate SBT, a lanthanum-modified bismuth titanate BLT and a lead zirconate titanate PZT.

8. The method as claimed in claim 1, wherein the first and second electrodes have a height of 100 Å~50000 Å.

9. The method as claimed in claim 1, wherein the sacrificial layer pattern has a form of a circular loop or a polygonal loop.

10. The method as claimed in claim 1, wherein in forming the sacrificial layer pattern, any one of oxide film, photosensitive film or a film having selectivity with the sacrificial layer pattern is used.

11. A method for fabricating a high density ferroelectric memory device, comprising:

forming an insulating film on a semiconductor substrate; selectively etching the insulating film to form a contact hole so as to expose a part of the semiconductor substrate;

forming a plug to bury it into the contact hole; forming a barrier film on the plug to completely fill the contact hole;

sequentially forming a seed layer and a sacrificial layer on the insulating film including the barrier film;

selectively etching the sacrificial layer to form a loop-shaped sacrificial layer pattern;

simultaneously forming first and second electrodes on the seed layer thus exposed after formation of the sacrificial layer pattern; removing the sacrificial layer pattern;

etching the seed layer thus exposed after removal of the sacrificial layer pattern; and forming a ferroelectric thin film by carrying out a spin-on process on an entire surface including the first and second electrodes.

12. The method as claimed in claim 11, wherein the first electrode and the second electrodes are formed by electrochemical deposition technique.

13. The method as claimed in claim 11, wherein the seed layer and the first and second electrodes are formed by using any one of Pt, Ir, IrOx or RuOx.

14. The method as claimed in claim 11, wherein in forming the sacrificial layer pattern, any one of oxide film, photosensitive film or a film having selectivity with the sacrificial layer pattern is used.

15. The method as claimed in claim 11, wherein the sacrificial layer pattern has a form of a circular loop or a polygonal loop.

16. The method as claimed in claim 11, wherein the first electrode is formed within the loop-shaped sacrificial layer pattern, and the second electrode is formed outside the sacrificial layer pattern.

17. The method as claimed in claim 11, wherein the first and second electrodes are separated from each other as much as 50 Å~10000 Å.

18. The method as claimed in claim 11, wherein the first and second electrodes respectively have a height of 100 Å~50000 Å.

* * * * *